US012699123B2

(12) United States Patent
Mohanty et al.

(10) Patent No.: US 12,699,123 B2
(45) Date of Patent: Aug. 4, 2026

(54) METHOD AND SYSTEM FOR DETERMINING A CAPACITANCE VALUE

(71) Applicant: EATON INTELLIGENT POWER LIMITED, Dublin (IE)

(72) Inventors: Satish Mohanty, Pune (IN); Gurmeet Singh, Pune (IN); Sauradeep Datta, Pune (IN); Deepak Balaji Somayajula, Pune (IN); Swati Narula, New Delhi (IN); Santosh Kumar Sharma, Pune (IN); Amresh Kumar, Bihar (IN)

(73) Assignee: Eaton Intelligent Power Limited, Dublin (IE)

( * ) Notice: Subject to any disclaimer, the term of this patent is extended or adjusted under 35 U.S.C. 154(b) by 314 days.

(21) Appl. No.: 18/080,449

(22) Filed: Dec. 13, 2022

(65) Prior Publication Data

US 2023/0194587 A1     Jun. 22, 2023

(30) Foreign Application Priority Data

Dec. 17, 2021     (IN) ............................. 202111058965

(51) Int. Cl.
  *G01R 27/26*     (2006.01)
  *G01R 19/02*     (2006.01)
  *G01R 27/08*     (2006.01)
(52) U.S. Cl.
  CPC ......... *G01R 27/2605* (2013.01); *G01R 19/02* (2013.01); *G01R 27/08* (2013.01)
(58) Field of Classification Search
  CPC .... G01R 19/02; G01R 27/08; G01R 27/2605;

G01R 1/00; G01R 3/00; G01R 5/00;
G01R 7/00; G01R 9/00; G01R 11/00;
G01R 13/00; G01R 15/00; G01R 17/00;
G01R 19/00; G01R 21/00; G01R 22/00;
G01R 25/00; G01R 27/00; G01R 29/00;
(Continued)

(56) References Cited

U.S. PATENT DOCUMENTS 8,796,982 B2     8/2014   Li
9,397,593 B2     7/2016   Kato

FOREIGN PATENT DOCUMENTS

CN       107870265 A      4/2018
CN       111220862 A   *  6/2020
GB         2175700 A   * 12/1986    ..... G01R 31/318385

OTHER PUBLICATIONS

European Search Report issued in corresponding application EP 22214049.3-1001, mailed on May 19, 2023 (9 pages).
(Continued)

*Primary Examiner* — Judy Nguyen
*Assistant Examiner* — Brent J Andrews
(74) *Attorney, Agent, or Firm* — Merchant & Gould P.C.

(57) ABSTRACT
A method for determining a capacitance value of a capacitor is provided. The method includes receiving a current signal flowing through the capacitor and receiving a voltage signal applied across the capacitor. The received voltage signal and the received current signal are filtered with a low pass filter. The filtered voltage signal and the filtered current signal are then discretized. The discretized voltage signal and the discretized current signal are transformed into a frequency domain. The capacitance value of the capacitor is determined from the transformed voltage signal and the transformed current signal.

20 Claims, 8 Drawing Sheets

(58) Field of Classification Search
CPC ........ G01R 31/00; G01R 35/00; G01R 33/00;
G01R 23/00
See application file for complete search history.

(56) References Cited

OTHER PUBLICATIONS

Soliman, Hammam et al. "A Review of the Condition Monitoring of
Capacitors in Power Electronic Converters"; IEEE Transactions on
Industry Applications, vol. 52, No. 6, Nov./Dec. 2016; XP011634697,
ISSN: 0093-994, DOI: 10.1109/TIA.2016.2591906 [retrieved on
Nov. 18, 2016] (14 pages).
European Office Action in corresponding application EP 22214049.
3-1001, mailed Jun. 5, 2025 (7 pages).

* cited by examiner

240

245

Determine an impedance of the capacitor from the transformed current signal and the transformed voltage signal

250

Determine a series resistance from a real part of the impedance of the capacitor

255

Determine a capacitive reactance from an imaginary part of the impedance of the capacitor

260

Determine the capacitance value from the capacitive reactance

270

275

Filter magnitudes of the transformed current signal and the transformed voltage signal at a pre-defined frequency range

280

Determine the impedance of the capacitor from the filtered magnitudes of the transformed current signal and the transformed voltage signal

285

Determine the capacitance value from the determined impedance

METHOD AND SYSTEM FOR DETERMINING A CAPACITANCE VALUE

CROSS-REFERENCE TO RELATED APPLICATION

This application claims the benefit of Indian Provisional Patent Application No. 202111058965, filed Dec. 17, 2021, entitled METHOD AND SYSTEM FOR DETERMINING A CAPACITANCE VALUE, the disclosure of which is incorporated herein by reference in its entirety.

TECHNICAL FIELD

The present disclosure relates generally to capacitors. More specifically, the present disclosure relates to determining a capacitance value of a capacitor.

BACKGROUND

Capacitors are commonly used components in electrical devices or systems. For example, capacitors are used as filters in power packs, inverters, etc. Factors like temperature fluctuations, voltage fluctuations, humidity fluctuations, increased vibrations and ripple currents, and variations in a load can lead to fluctuations in capacitance of a capacitor. The fluctuations in the capacitance can lead to failure or an un-interrupted downtime of the electrical device. Hence, continuous monitoring and detection of fault is needed to detect degradation in the capacitor. Inductance (L), Capacitance (C), and Resistance (R) (LCR) meter is a commonly known device to estimate the capacitance value of a capacitance. The LCR meter is used as an off-line technique and can be an intrusive measurement technique.

SUMMARY

One aspect of the present disclosure provides a method for determining a capacitance value of a capacitor. The method includes receiving a current signal flowing through the capacitor and receiving a voltage signal applied across the capacitor. The received voltage signal and the received current signal are filtered with a low pass filter. The filtered voltage signal and the filtered current signal are then discretized. The discretized voltage signal and the discretized current signal are transformed into a frequency domain. The capacitance value of the capacitor is determined from the transformed voltage signal and the transformed current signal.

Another aspect of the present disclosure provides a method for determining a capacitance value of a capacitor. The method includes receiving a current signal flowing through the capacitor and receiving a voltage signal applied across the capacitor. The received voltage signal and the received current signal are filtered with a low pass filter. The filtered voltage signal and the filtered current signal are sampled. A fast Fourier transform is performed for each of the sampled voltage signal and the sampled current signal. An impedance of the capacitor is determined from the transformed voltage signal and the transformed current signal. A capacitive reactance of the capacitor is determined from an imaginary part of the impedance. The capacitance value of the capacitor is determined from the capacitive reactance.

Yet another aspect of the present disclosure provides a method for determining a capacitance value of a capacitor. The method includes receiving a current signal flowing through the capacitor and receiving a voltage signal applied across the capacitor. The received voltage signal and the received current signal are filtered with a low pass filter. The filtered voltage signal and the filtered current signal are discretized. A fast Fourier transform is performed for each of the sampled voltage signal and the sampled current signal. Magnitudes of the transformed current signal and the transformed voltage signal are filtered at a pre-defined frequency with a band pass filter. An impedance of the capacitor is determined from the filtered magnitudes of the transformed current signal and the transformed voltage signal. The capacitance value of the capacitor is determined from the determined impedance.

These and other features and advantages will be apparent from a reading of the following detailed description and a review of the associated drawings. A variety of additional aspects will be set forth in the description that follows. These aspects can relate to individual features and to combinations of features. It is to be understood that both the foregoing general description and the following detailed description are exemplary and explanatory only and are not restrictive of the broad concepts upon which the embodiments disclosed herein are based.

BRIEF DESCRIPTION OF THE DRAWINGS

The accompanying drawings which are incorporated in and constitute a part of the description, illustrate several aspects of the disclosure. A brief description of the drawings is as follows.

DETAIL DESCRIPTION

Reference will now be made in detail to exemplary aspects of the present disclosure that are illustrated in the accompanying drawings. Wherever possible, the same reference numbers will be used throughout the drawings to refer to the same or like structure.

The present disclosure provides techniques for determining a capacitance value of a capacitor. The capacitance value is estimated passively during the operation of the capacitor. In certain examples, the capacitance value is estimated from a current signal flowing through the capacitor and a voltage signal applied across the capacitor at a dominant frequency and at a ripple frequency.

Figure 1:
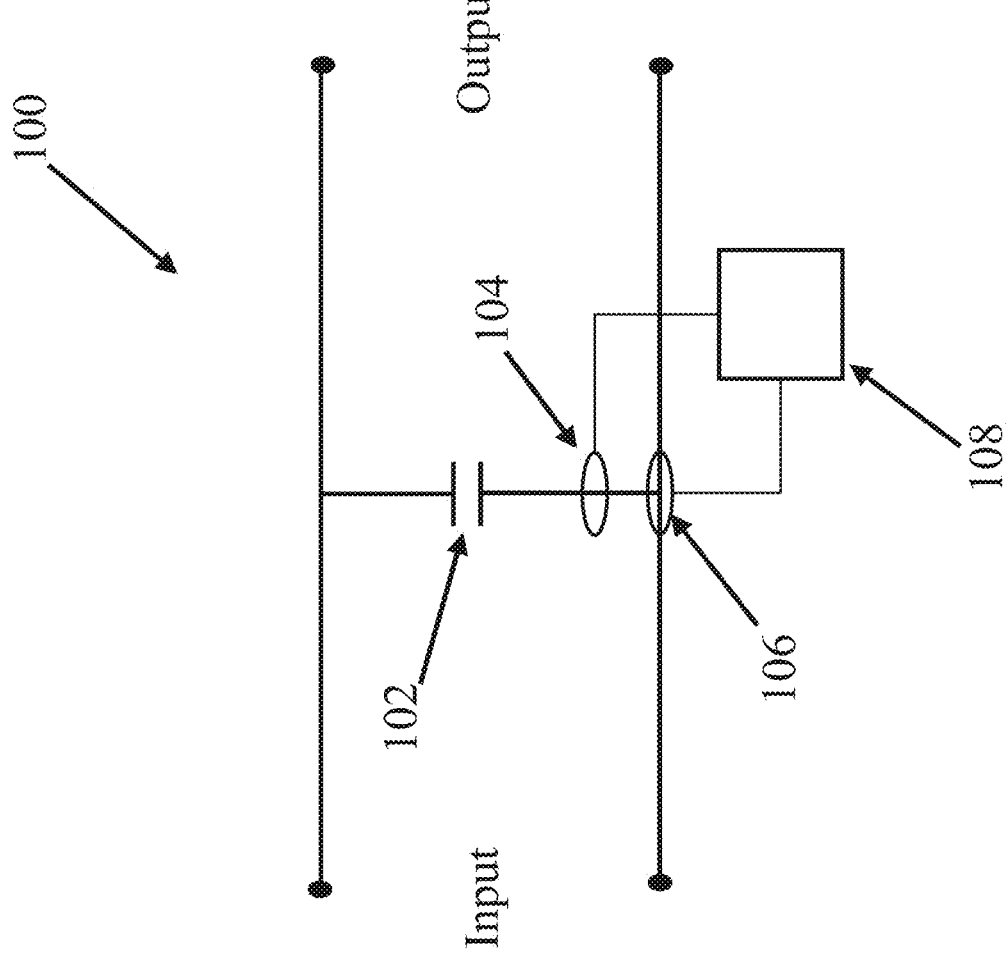
FIG. 1 illustrates an example environment in accordance with principles of the present disclosure.

FIG. 1 illustrates an example operating environment 100 in accordance with examples of the present disclosure. As illustrated in FIG. 1, example environment 100 includes a capacitor 102, a current sensor 104, a voltage sensor 106, and a capacitance estimator 108. In certain examples, environment 100 further includes an input side and an output side. The input side may include a power source and the output side may include an electrical load, for example, a motor. Capacitor 102 can be part of an electrical device, for example, an invertor driving the motor. In certain examples, capacitor 102 can be a ceramic capacitor, a film and paper capacitor, a polymer capacitor, an electrolytic capacitor, etc.

Current sensor 104 measures a current flowing though capacitor 102. In some examples, current sensor 104 measures the current flowing through capacitor 102 using a magnetic field and without interrupting the working of capacitor 102. Voltage sensor 106 measures a voltage applied across the capacitor. Voltage sensor 106 also measures the voltage applied across capacitor 102 without interrupting the working of capacitor 102. In examples, the current flowing through capacitor 102 and measured by current sensor 104 is represented in time domain as current signal I(t). Similarly, the voltage applied across capacitor 102 and measured by voltage sensor 106 can be represented in time domain as voltage signal V(t). In certain examples, the current signal I(t) and the voltage signal V(t) are time domain analog signals.

Current sensor 104 and voltage sensor 106 provide the measured current signal I(t) and the measured voltage signal V(t) to capacitance estimator 108. For example, capacitance estimator 108 can be connected to both current sensor 104 and voltage sensor 106. Capacitance estimator 108 determines or estimates the capacitance value of capacitor 102 from the current signal I(t) and the voltage signal V(t) received from current sensor 104 and voltage sensor 106 respectively. In certain examples and discussed in greater detail in the following portions of the specification, capacitance estimator 108 estimates the capacitance value of capacitor 102 passively without interrupting the functioning of capacitor 102. That is, capacitance estimator 108 can estimate the capacitance value of capacitor 102 during use, that is, when capacitor 102 is online. Thus, capacitance estimator 108 can estimate the capacitance value of capacitor 102 without taking capacitor 102 offline.

Figure 2:
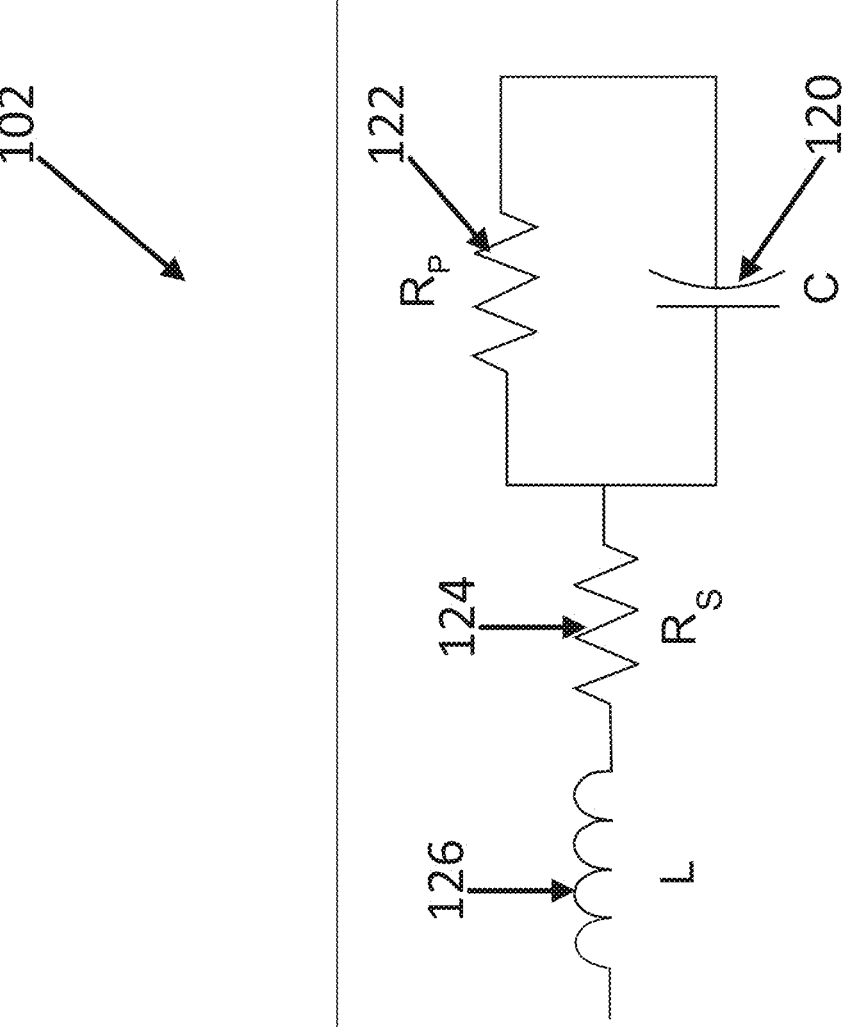
FIG. 2 illustrates an equivalent model of a capacitor.

FIG. 2 illustrates an equivalent model of capacitor 102. In examples, discrete capacitors, such as capacitor 102, deviate from ideal capacitors that only stores and releases electrical energy with no dissipation. Capacitor 102, unlike ideal capacitor has losses and parasitic inductive parts. Hence, properties of capacitor 102 can be defined and specified by the equivalent circuit or model shown in FIG. 2. As shown in FIG. 2, the equivalent model of capacitor 102 is composed of an idealized capacitor (C) 120, a parallel resistor (Rp) 122, a series resistor (Rs) 124, and an inductor (L) 126. Parallel resistor (Rp) 122 may represent an insulation resistance (Rins) of a dielectric material of capacitor 102 and a resistance representing a leakage current (Rleak) of capacitor 102. Series resistor (Rs) 124 may represent ohmic losses of capacitor 102 and is also referred to as an Equivalent Series Resistor (ESR). Inductor (L) 126 may represent a self-inductance of capacitor 102 and is also referred to as an Equivalent Series Inductance (ESL).

In certain examples, both, idealized capacitance (C) 120 and inductor (L) 126 are frequency driven impedances and thus can vary with the frequency. For example, capacitive impendence $X_C$ is calculated as:

$$x_c = \frac{1}{2\pi f C}$$

Hence, when the frequency increases, the capacitive impedance $X_C$ decreases. Similarly, inductive reactance $X_L$ is calculated as:

$$x_L = 2\pi f L$$

Thus, when the frequency increases, the inductive reactance $X_L$ also increases. In certain examples, inductor (L) 126 may be small and its influence can generally be seen only at high frequencies.

Figure 3:
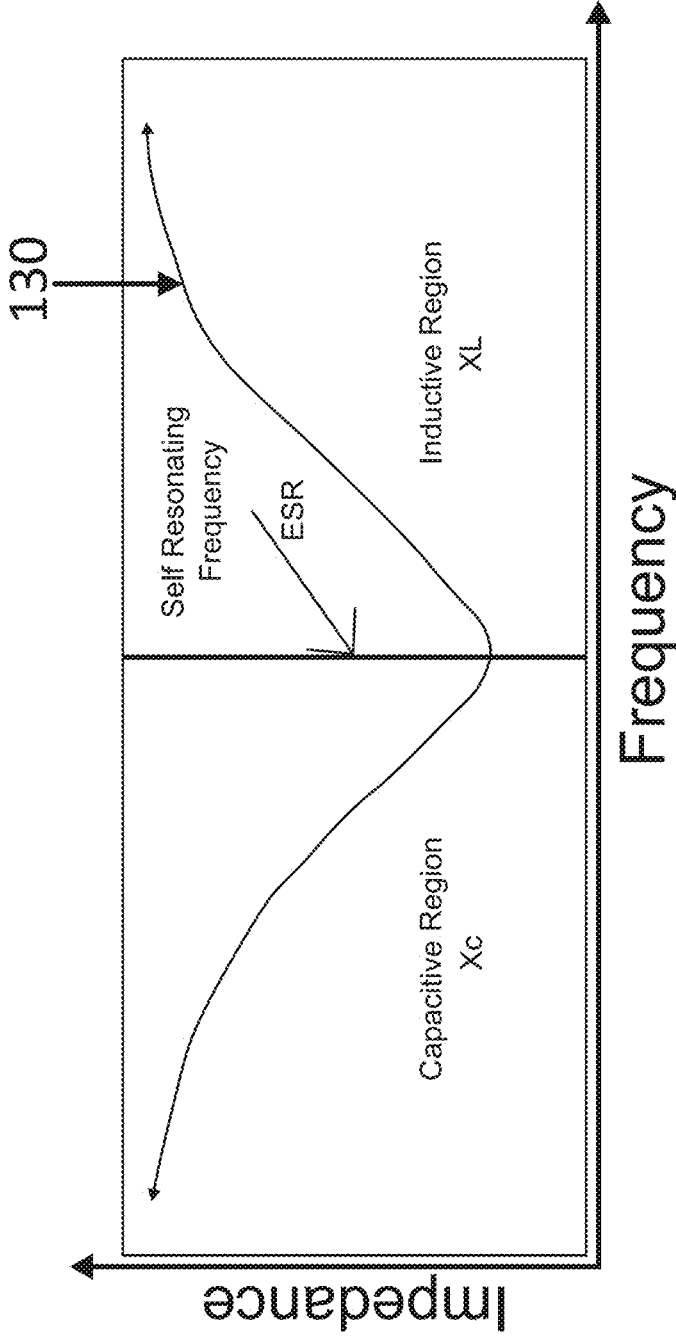
FIG. 3 illustrates an impedance spectrum of a capacitor.

FIG. 3 illustrates an impedance spectrum 130 of capacitor 102. As shown in FIG. 3, impedance spectrum 130 of capacitor 102 is generally V-shaped. For example, up until a self-resonating frequency, the capacitive characteristics (that is, the capacitive impedance $X_C$ of capacitor 102 is dominant. At the self-resonating frequency, the capacitive impedance $X_C$ and the reactive impedance $X_L$ cancel each other out, and the total impedance is purely resistive parts, that is, series resistor (Rs) 124 or ESR, of capacitor 102. After the self-resonating frequency, the inductive characteristics (that is, the inductive impedance $X_L$) of capacitor 102 is dominant. In examples, the self-resonating frequency is a frequency at which the capacitive impedance $X_C$ and the reactive impedance $X_L$ of capacitor 102 cause equally large but opposite impedances. In other examples, the impedance characteristics at different frequencies can be used to determine the capacitance value of capacitor 102.

Figure 4:
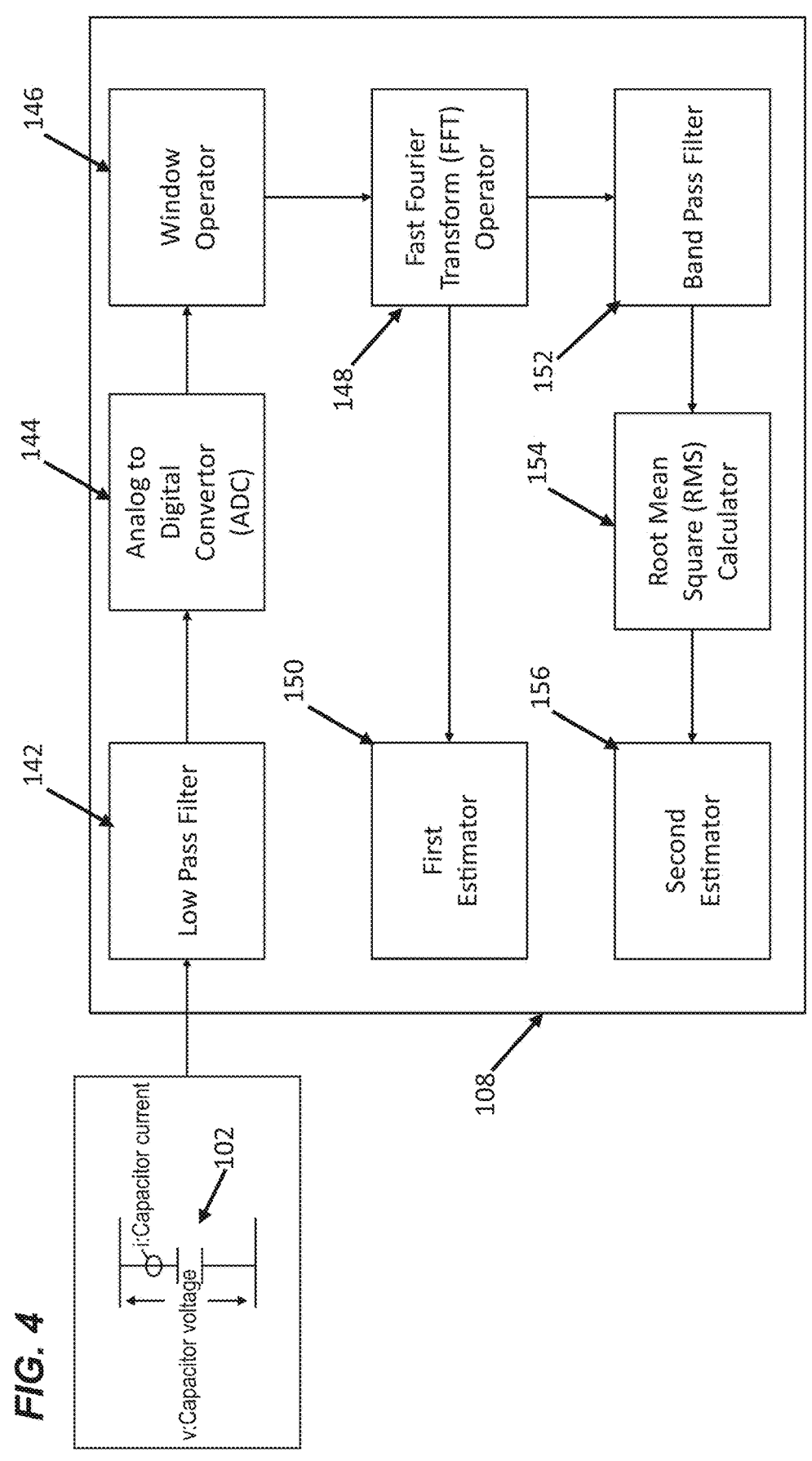
FIG. 4 illustrates components of a capacitance estimator.

FIG. 4 illustrates components of capacitance estimator 108 in accordance with principles of the present disclosure. As shown, capacitor estimator 108 includes a low pass filter 142, an analog to digital convertor 144, a window operator 146, a Fast Fourier Transform (FFT) operator 148, a first estimator 150, a band pass filter 152, a Root Mean Square (RMS) calculator 154, and a second estimator 156. In other examples, capacitance estimator 108 may include additional or less components than those depicted. The functioning of the components of capacitor estimator 108 will be described in the following sections of the disclosure in combination with methods of determining the capacitance value of capacitor 102.

Figure 5:
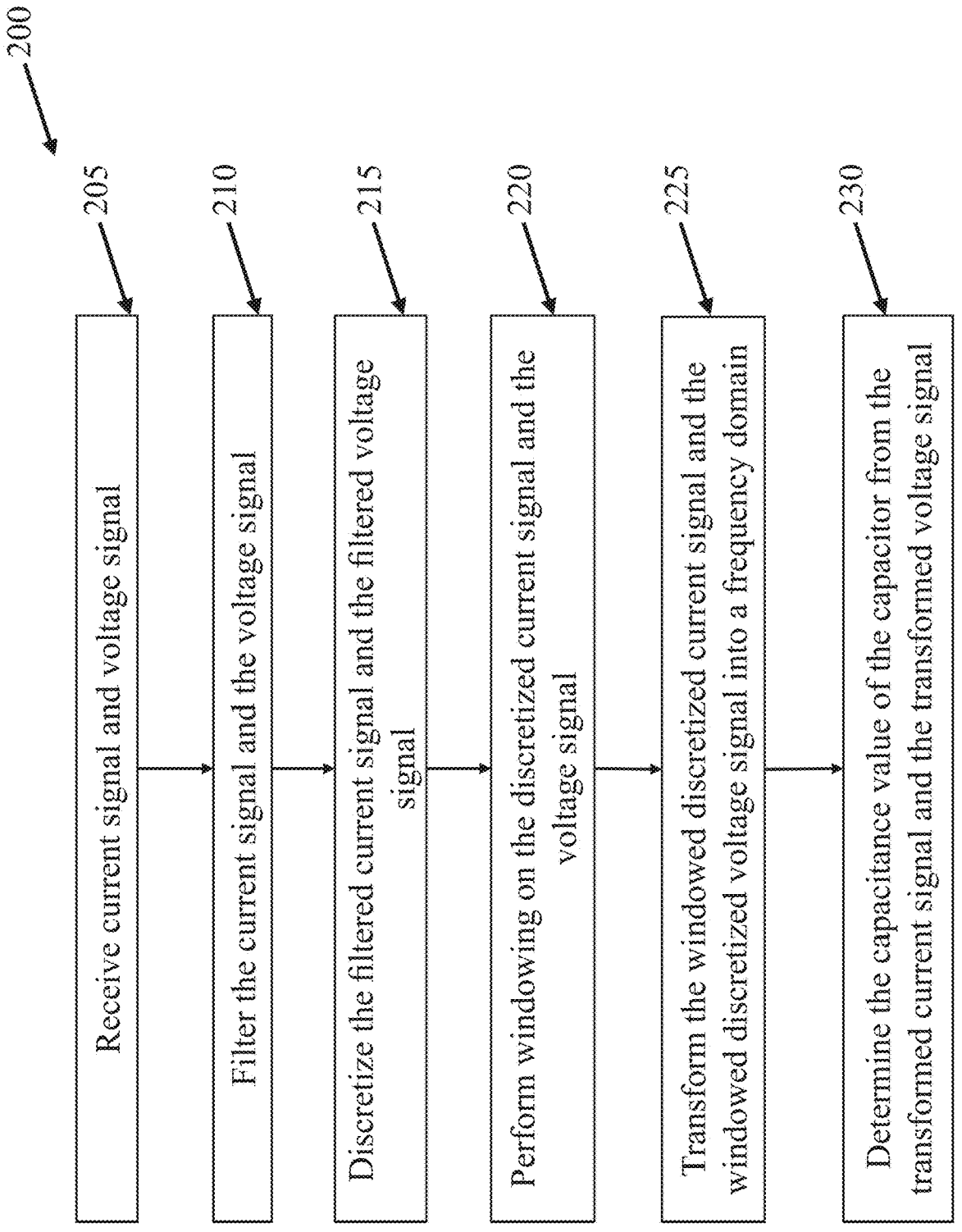
FIG. 5 illustrates a flow diagram of a method for determining the capacitance value of a capacitor.

FIG. 5 illustrates a flow diagram of a method 200 for determining the capacitance value of capacitor 102. In certain examples, method 200 can be performed by capacitance estimator 108. In other examples, method 200 is performed by a processor connected to a memory device. The memory device may store the instructions which, when executed by the processor, perform method 200.

At block 205 of method 200, the current signal I(t) and the voltage signal V(t) are received or acquired. For example, the current signal I(t) is received from current sensor 104 and the voltage signal V(t) is received from voltage sensor 106. In certain examples, the current signal I(t) and the voltage signal V(t) are received at low pass filter 142. For example, low pass filter 142 can be connected to each of current sensor 104 and voltage sensor 106 and receives the current signal I(t) from current sensor 104 and the voltage signal V(t) from voltage sensor 106.

At block 210 of method 200, the received current signal I(t) and the received voltage signal V(t) are filtered. The received current signal I(t) and the voltage signal V(t) are filtered using low pass filter 142. In certain examples, the current signal I(t) and the voltage signal V(t) are filtered simultaneously or in parallel. For examples, low pass filter 142 can include multiple filters for filtering the current signal I(t) and the voltage signal V(t) simultaneously. The current signal I(t) and the voltage signal V(t) can be filtered simultaneously using dedicated low pass filters 142.

Low pass filter 142, in some examples, allows signals with a frequency lower than a selected cut-off frequency and attenuates signals with frequencies higher than the cut-off frequency. In certain examples, the cut-off frequency can be selected as a dominant frequency, a ripple frequency, or a switching frequency. In other examples, the cut-off frequency can be a multiple of a dominant frequency, a ripple frequency, and/or a switching frequency. In some other examples, the cut-off frequency can be harmonics of a dominant frequency, a ripple frequency, and/or a switching frequency. The dominant frequency is the frequency with a maximum amplitude. The switching frequency is the frequency at which the inverter is operating. The dominant frequency and the switching frequency can depend on the inverter design and applications. In some examples, the switching frequency can be either 8 kHz or 12 kHz. The ripple frequency is the higher order frequency components of either the dominant frequency or the switching frequency. In some examples, the ripple frequency can be dominant as compared to its fundamental frequency.

At block 215 of method 200, the filtered current signal I(t) and the filtered voltage signal V(t) are discretized. In certain examples, the filtered current signal I(t) and the filtered voltage signal V(t) are discretized by sampling. The current signal I(t) and the voltage signal V(t) are sampled using Analog to Digital Convertor (ADC) 144. For example, ADC 144 is connected to low pass filter 142 and receives the filtered current signal I(t) and the filtered voltage signal V(t) from low pass filter 142.

A rate of sampling can be pre-defined. For example, the current signal I(t) and the voltage signal V(t) may be sampled at a rate of 32 samples per cycle. During sampling, the filtered current signal I(t) and the filtered voltage signal V(t) can be reduced from continuous time signals to discrete time signals. In certain examples, sampling is performed by measuring a value of the current signal I(t) and the voltage signal V(t) over a sampling interval or a sampling period represented by T seconds. The filtered current signal I(t) and the filtered voltage signal V(t) can be sampled simultaneously or in parallel. For example, each of the filtered current signal I(t) and the filtered voltage signal V(t) can be sampled simultaneously using dedicated ADCs 144. In certain examples, since the filtered current signal I(t) and the filtered voltage signal V(t) are at the dominant frequency and the ripple frequency, the rate of sampling can be lower compared to that at the switching frequency. In examples, the sampling rate or the sampling frequency can be 5 to 10 times of the frequency of interest. The frequency of interest can be either one of the dominant frequency, the switching frequency, or the ripple frequency. The sampling period is the inverse of the sampling frequency.

At block 220 of method 200, windowing is performed on the discretized current signal I(t) and the discretized voltage signal V(t). In examples, the windowing is performed by window operator 146. For example, window operator 146 can be connected to ADC 144 and receives the discretized current signal I(t) and the discretized voltage signal V(t) from ADC 144. Window operator 146 then performs the windowing on the discretized current signal I(t) and the discretized voltage signal V(t). During windowing, the discretized current signal I(t) and voltage signal V(t) are multiplied by a pre-defined window function. The product of the multiplication has a zero value outside a chosen interval and all that is remaining is where the discretized current signal I(t) and voltage signal V(t) and the window function overlap. In certain examples, the window function is a finite length window with an amplitude that varies smoothly and gradually toward zero at the edges. In certain examples, the window function can include a Hanning window function. In certain examples, the windowing is performed on the discretized current signal I(t) and the discretized voltage signal V(t) to detect transient events and time averaging of frequency spectra. In examples, the discretized current signal I(t) and the discretized voltage signal V(t) are windowed simultaneously or in parallel. For example, each of the discretized current signal I(t) and the discretized voltage signal V(t) can be filtered simultaneously using dedicated window operators 146.

At block 225 of method 200, the windowed discretized current signal I(t) and the windowed discretized voltage signal V(t) are transformed into a frequency domain. In certain examples, the windowed discretized current signal I(t) and the windowed discretized voltage signal V(t) are transformed into the frequency domain using Fast Fourier Transform (FFT) operator 148. For example, FFT operator 148 can be connected to window operator 146 and receives the windowed discretized current signal I(t) and the windowed discretized voltage signal V(t) from window operator 146. FFT operator 148 then transforms the windowed discretized current signal I(t) and the windowed discretized voltage signal V(t) from the time domain to frequency domain. For example, FFT operator 148 determines discrete Fourier transform of each of the windowed discretized current signal I(t) and the windowed discretized voltage signal V(t).

In certain examples, the frequency domain representation of the windowed discretized current signal I(t) and the windowed discretized voltage signal V(t) shows currents and voltages present at different frequencies. In certain examples, the windowed discretized current signal I(t) and the windowed discretized voltage signal V(t) are transformed simultaneously or in parallel. For example, each of the windowed discretized current signal I(t) and the windowed discretized voltage signal V(t) are transformed simultaneously using dedicated FFT operators 148.

At block 230 of method 200, the capacitance value of capacitor 102 is determined from the transformed current signal I(t) and the transformed voltage signal V(t). In some examples and discussed in greater detail in the following portions, the disclosure provides two methods to determine the capacitance value of capacitor 102 from the transformed current signal I(t) and the transformed voltage signal V(t).

Figure 6:
FIG. 6 illustrate a flow diagram of a first method for determining the capacitance value of a capacitor.

FIG. 6 illustrates first method 240 for determining the capacitance value of capacitor 102 from the transformed current signal I(t) and the transformed voltage signal V(t). In some examples, first method 240 is performed by capacitance estimator 108. In other examples, method 240 is performed by a processor connected to a memory device. The memory device may store the instructions which, when executed by the processor, perform method 240.

At block 245 of first method 240, an impedance Z of capacitor 102 is determined from the transformed current I(t) and voltage V(t) signals. In certain examples, the impedance Z of capacitor 102 is determined by first estimator 150. For example, first estimator 150 is connected to FFT operator 148 and receives the transformed current signal I(t) and the transformed voltage signal V(t) from FFT operator 150. First estimator 150 then determines the impedance Z from the transformed current signal I(t) and the transformed voltage signal V(t).

In certain examples, the impedance Z is determined by dividing the transformed voltage signal V(t) with the transformed current signal I(t). For example, the transformed voltage signal V(t) is divided by the transformed current signal I(t) at a dominant frequency, where the amplitudes of the current signal I(t) and voltage signal V(t) are maximum. For example, the impedance Z is represented as:

$$Z = ESR + i(X_L - X_C) \qquad (1)$$

In certain examples, the reactance $X_L$ is very small at the dominant frequency and can be ignored. Therefore, the impedance Z can be calculated as:

$$Z = ESR + i(-X_C) \qquad (2)$$

Figure 8:
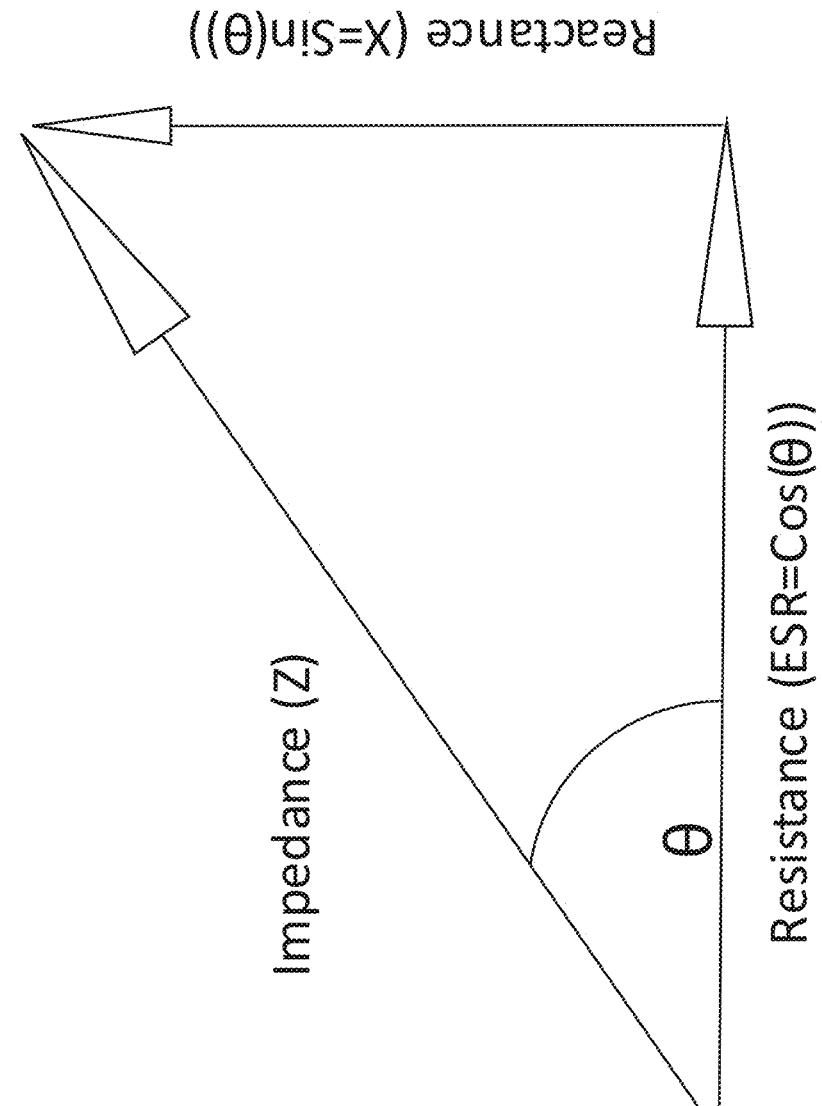
FIG. 8 illustrates an impedance triangle of a capacitor.

A resultant vector diagram of impedance Z is shown in FIG. 8. The vector diagram of the impedance Z is also referred to as an impedance triangle where the sides of the triangle represent the real and imaginary portions of the impedance Z.

In certain examples, the discretized current signal I(t) and the discretized voltage signal V(t) can be transformed at the dominant frequencies ($f_{df}$), the ripple frequency ($f_{rf}$), or at their respective harmonics using FFT operator 148. Hence, the impedance Z at the ripple frequency is calculated as:

$$Z(kf_{rf}) = \frac{(real(V(kf_{rf})) + imag(V(kf_{rf})))}{(real(I(kf_{rf})) + imag(I(kf_{rf})))} \qquad (3)$$

where $V(kf_{rf})$ and $I(kf_{rf})$ are the voltage and current values obtained from the FFT carried out on the windowed discretized current signal I[n] and the windowed discretized voltage signal V[n] at the ripple frequency and where k is {1, 2, 3, 4, 5, ... }. Similarly, the impedance Z at the dominating frequency can be calculated as:

$$Z(kf_{df}) = \frac{(real(V(kf_{df})) + imag(V(kf_{df})))}{(real(I(kf_{df})) + imag(I(kf_{df})))} \qquad (4)$$

where $V(kf_{df})$ and/$(kf_{df})$ are the voltage and current values obtained from the FFT carried out on the windowed discretized current signal I[n] and the windowed discretized voltage signal V[n] at the dominating frequency and where k is {1, 2, 3, 4, 5, ... }.

At block 250 of first method 240, ESR 124 for capacitor 102 is determined from a real part of the impedance Z. For example, from the impedance triangle of FIG. 8, ESR=ZCos (θ) (or) real(Z). Hence, ESR 124 at the ripple frequency is calculated as:

$$ESR(kf_{rf}) = real(Z(kf_{rf})) \qquad (5)$$

Similarly, ESR 124 at the dominating frequency is calculated as:

$$ESR(kf_{df}) = real(Z(kf_{df})) \qquad (6)$$

In certain examples, ESR 124 is determined by first estimator 150.

At block 255 of first method 240, a capacitive reactance is estimated from an imaginary part of the impedance Z. For example, from the impedance triangle of FIG. 8, $X_c$=ZSin(θ) (or) imag(Z). Hence, the capacitive reactance $X_c$ at the ripple frequency is calculated as:

$$X_C(kf_{rf}) = imag(Z(kf_{rf})) \qquad (7)$$

Similarly, the capacitive reactance $X_C$ at the dominating frequency is calculated as:

$$X_C(kf_{df}) = imag(Z(kf_{df})) \qquad (8)$$

In certain examples, the capacitive reactance $X_C$ is determined by first estimator 150.

At block 260 of first method 240, the capacitance value of capacitor 102 is determined from the capacitive reactance $X_C$. For example, the capacitance value of capacitor 102 at the ripple frequency is calculated from the capacitive reactance $X_C$ as:

$$C_{estm1}(kf_{rf}) = \frac{1}{2\pi k f_{rf} X_C(kf_{rf})} \qquad (9)$$

where ESR($kf_{rf}$) and $C_{estm1}(kf_{rf})$ are ESR 124 and the estimated capacitance value of capacitor 102 at the ripple frequency. Similarly, the capacitance value of capacitor 102 at the dominant frequency is calculated from the capacitive reactance $X_C$ as:

$$C_{estm1}(kf_{df}) = \frac{1}{2\pi k f_{df} X_C(kf_{df})} \qquad (10)$$

where ESR($kf_{df}$) and $C_{estm1}$ ($kf_{df}$) are ESR 124 and the estimated capacitance value of capacitor 102 at the dominating frequency. In certain examples, the capacitance values (that is, $C_{estm1}(kf_{rf})$ and $C_{estm1}(kf_{df})$) from the capacitive reactance $X_c$ are determined by first estimator 150.

Figure 7:
FIG. 7 illustrates a flow diagram of a second method for determining the capacitance value of a capacitor.

FIG. 7 illustrates a second method 270 for determining the capacitance value of capacitor 102. Second method 270 utilizes the dominant frequency to determine the capacitance value. In certain examples, method 270 can be performed by capacitance estimator 108. In other examples, method 270 is performed by a processor connected to a memory device. The memory device may store the instructions which, when executed by the processor, perform method 270.

In certain examples, the windowed discretized time series signals (that is, the windowed discretized voltage signal $V_y[n]$ and the windowed discretized current signal $I_y[n]$) are obtained by passing the discretized current signal I[n] and the discretized voltage signal V[n] through a window function w [n] to obtain the windowed discretized current signal $I_y[n]$ and the windowed discretized voltage signal $V_y[n]$ respectively. For example, the windowed discretized voltage signal $V_y[n]$ is calculated as:

$$V_y[n] = V[n]w[n] \qquad (11)$$

Similarly, the windowed discretized current signal $I_y[n]$ is Calculated as:

$$I_y[n] = I[n]w[n] \tag{12}$$

In certain examples, the windowed discretized voltage signal $V_y(n)$ and the windowed discretized current signal $I_y(n)$ are converted into the frequency domain using FFT operator 148. For example, the windowed discretized voltage signal $V_y(n)$ is converted into the frequency domain as:

$$V[k] = \sum_{n=0}^{N-1} V_y[n]e^{-j2\pi kn/N} \tag{13}$$

where $V[k]$ is a magnitude of the windowed discretized voltage signal $V_y(n)$ in the frequency domain. Similarly, the windowed current signal $I_y(n)$ is converted into the frequency domain as:

$$I[k] = \sum_{n=0}^{N-1} I_y[n]e^{-j2\pi kn/N} \tag{14}$$

where $I[k]$ is a magnitude of the windowed discretized current signal $I_y(n)$ in the frequency domain. Second method 270 determines the capacitance value of capacitor 102 from the magnitudes of the voltage signal $V[k]$ and the current signal $I[k]$ in the frequency domain.

For example, at block 275 of second method 270, the magnitudes of the voltage signal $V[k]$ and the current signal $I[k]$ are filtered at a pre-defined frequency range. In certain examples, the magnitudes of the voltage signal $V[k]$ and the current signal $I[k]$ are filtered at the pre-defined range using band pass filter 152. For example, band pass filter 152 is connected to FFT operator 148 and receives the magnitudes of the voltage signal $V[k]$ and the current signal $I[k]$ from FFT operator 148. Band pass filter 152 then filters both the magnitude of the voltage signal $V[k]$ and the magnitude of the current signal $I[k]$ at the pre-defined range. In certain examples, the magnitudes of the current signal $I[k]$ and the voltage signal $V[k]$ are filtered simultaneously or in parallel. For examples, band pass filter 152 can include multiple filters for filtering the magnitudes of the current signal $I[k]$ and the voltage signal $V[k]$ simultaneously. For example, the magnitudes of each of the current signal $I[k]$ and the voltage signal $V[k]$ are filtered simultaneously using dedicated band pass filters 152. In certain examples, pre-defined range of the bandpass filtered is centered around either one of the dominant frequency, the ripple frequency, or the switching frequency with a variable deviation. The deviation or bandwidth can be far smaller than the dominant frequency, the ripple frequency, or the switching frequency. In certain examples, pre-defined range is determined as a center frequency plus upper cutoff frequency and the center frequency minus lower cutoff frequency, where the center frequency is one of the dominant frequency, the ripple frequency, or the switching frequency.

In certain examples, band pass filter 152 passes frequencies within the pre-defined range and attenuates frequencies outside of that range. In some examples, the pre-defined range is centered around the dominating frequency, the ripple frequency, or their harmonics. For example, the magnitude of the voltage signal $V[k]$ can be filtered at the dominating frequency as:

$$V_{kf_{df}}[k] = V[k] \cdot H[k] \tag{15}$$

where $H[k]$ is band pass filter function. Similarly, the magnitude of the current signal $I[k]$ can be filtered at the dominating frequency as:

$$I_{kf_{df}}[k] = V[k] \cdot H[k] \tag{16}$$

At block 280 of second method 270, the impedance Z is determined from the filtered magnitudes of the current signal $I_{kf_{df}}[k]$ and the voltage signal $V_{kf_{df}}[k]$. In examples, the impedance Z is calculated from Root Mean Square (RMS) values of the filtered current signal $I_{kf_{df}}[k]$ and the voltage signal $V_{kf_{df}}[k]$. For example, RMS calculator 154 is connected to band pass filter 152 and receives the filtered magnitudes of the current signal $I_{kf_{df}}[k]$ and the voltage signal $V_{kf_{df}}[k]$ from band pass filter 152. RMS calculator 152 then determines the RMS values of the filtered magnitudes of the current signal $I_{kf_{df}}[k]$ and the voltage signal $V_{kf_{df}}[k]$. In certain examples, the RMS values of the filtered magnitudes of the current signal $I_{kf_{df}}[k]$ and the voltage signal $V_{kf_{df}}[k]$ are determined simultaneously or in parallel. For example, the RMS values for each of the filtered magnitudes of the current signal $I_{kf_{df}}[k]$ and the voltage signal $V_{kf_{df}}[k]$ are determined simultaneously using dedicated RMS calculators 152.

In certain examples, the impedance Z is calculated as:

$$Z_{estm2} = \frac{RMS\left(V_{kf_{df}}\right)}{RMS\left(I_{kf_{df}}\right)} \tag{17}$$

where $Z_{estm2}$ is the estimated impedance at the dominating frequency. In certain examples, the $Z_{estm2}$ is determined by second estimator 156. For example, second estimator 156 is connected to RMS calculator 154 and receives the RMS values of each of the filtered magnitudes of the current signal $I_{kf_{df}}[k]$ and the voltage signal $V_{kf_{df}}[k]$ from RMS calculator 154. Second estimator 156 then determines $Z_{estm2}$ from the RMS values of the filtered magnitudes of the current signal $I_{kf_{df}}[K]$ and the voltage signal $V_{kf_{df}}[k]$.

At block 285 of second method 270, the capacitance value of capacitor 102 is determined from the impedance value $Z_{estm2}$. For example, the capacitance value of capacitor 102 is calculated as:

$$C_{estm2} = \frac{1}{(2\pi f_{df}Z_{estm2})} \tag{18}$$

where $C_{estm2}$ is the estimated capacitance value at the dominating frequency. In certain examples, the $C_{estm2}$ is determined by second estimator 156.

In certain examples, the techniques disclosed herein provide a real time online estimate of the capacitance value and ESR 124 of capacitor 102. The disclosed techniques use the dominant and/or ripple frequencies for analysis, therefore, estimation of the parameters can be achieved at low sampling rate (for example, 10 kHz). Due to a lower sampling rate, the techniques disclosed herein can be implemented on an embedded board with lower memory. The techniques disclosed herein are independent of type, manufacturer, and make of capacitor 102. In addition, the techniques disclosed herein are applicable for individual capacitor as well as capacitor banks. Moreover, the estimation errors are independent of the load and or Revolution Per Minute (RPM) of the load under test.

In certain examples, the techniques disclosed herein can be used for online estimation of the capacitance value and ESR 124 of Direct Current (DC) capacitor in High Voltage DC (HVDC) fuel pump application. In addition, the techniques disclosed herein can be applied to individual, as well as, bank level capacitors used in a DC link various other applications like inverters, converters, etc. Moreover, it can be used in Uninterrupted Power Supply (UPS) applications, HVDC fuel pumps, Alternate Fuel Transfer Manifolds (AF-TMs), industrial drives, aircrafts, and electric vehicles-inverters/converters, etc.

From the forgoing detailed description, it will be evident that modifications and variations can be made without departing from the spirit and scope of the disclosure.

What is claimed is:

1. A method for determining a capacitance value of a capacitor, the method comprising:
measuring, by a current sensor, a current signal flowing through the capacitor;
measuring, by a voltage sensor, a voltage signal applied across the capacitor;
receiving, by a first low pass filter connected to the current sensor, the current signal;
filtering, by the first low pass filter, the received voltage signal at a dominant frequency, wherein the dominant frequency is a frequency with a maximum amplitude, and wherein the first low pass filter attenuates current signals with frequencies higher than the dominant frequency;
receiving, by a second low pass filter connected to the voltage sensor, the voltage signal;
filtering, by the second low pass filter, the received current signal at the dominating frequency, wherein the second low pass filter attenuates voltage signals with frequencies higher than the dominant frequency;
discretizing, by an Analog to Digital Converter (ADC) connected to the first low pass filter and the second low pass filter, each of the filtered voltage signal and the filtered current signal, wherein discretizing each of the filtered voltage signal and the filtered current signal comprises measuring a value of the current signal and the voltage signal over a sampling interval;
transforming each of the discretized voltage signal and the discretized current signal into frequency domain, wherein transforming each of the discretized voltage signal and the discretized current signal into frequency domain comprises determining currents and voltages present in each of the discretized voltage signal and the discretized current signal at different frequencies; and
determining the capacitance value of the capacitor from the transformed voltage signal and the transformed current signal.

2. The method of claim 1, wherein determining the capacitance value of the capacitor from the transformed voltage signal and the transformed current signal comprises:

determining an impedance of the capacitor from the transformed voltage signal and the transformed current signal;
determining a capacitive reactance of the capacitor from an imaginary part of the impedance; and
determining the capacitance value of the capacitor from the capacitive reactance.

3. The method of claim 2, further comprising:
determining a series resistance of the capacitor from a real part of the impedance.

4. The method of claim 1, wherein determining the impedance of the capacitor from the transformed voltage signal and the transformed current signal further comprises determining the impedance of the capacitor from the transformed voltage signal and the transformed current signal transformed at the dominant frequency.

5. The method of claim 1, wherein transforming each of the discretized voltage signal and the discretized current signal into the frequency domain comprises performing a fast Fourier transform of each of the discretized voltage signal and the discretized current signal.

6. The method of claim 1, further comprising windowing the discretized voltage signal and the discretized current signal.

7. The method of claim 1, wherein each of the discretized voltage signal and the discretized current signal are transformed into the frequency domain in parallel.

8. The method of claim 1, wherein determining the impedance of the capacitor from the transformed voltage signal and the transformed current signal comprises determining the impedance as $$Z(kf_{df}) = \frac{\left(\text{real}(V(kf_{df})) + imag(V(kf_{df}))\right)}{\left(\text{real}(I(kf_{df})) + imag(I(kf_{df}))\right)}$$

where $V(kf_{df})$ and $I(kf_{df})$ are the voltage and current values obtained from the transformed discretized current signal I[n] and the transformed discretized voltage signal V[n] at the dominating frequency and where k is {1, 2, 3, 4, 5, . . . }.

9. The method of claim 8, further comprising determining the capacitive reactance of the capacitor from the imaginary part of the impedance as:
$X_C(kf_{df}) = imag(Z(kf_{df}))$.

10. The method of claim 9, further comprising determining the capacitance value of the capacitor from the capacitive reactance as:

$$C_{estm1}(kf_{df}) = \frac{1}{2\pi kf_{df}X_C(kf_{df})}$$

where $f_{df}$ is the dominating frequency.

11. A method for determining a capacitance value of a capacitor, the method comprising:
measuring, by a current sensor, a current signal flowing through the capacitor;
receiving, from the current sensor, the current signal flowing through the capacitor;
measuring, by a voltage sensor, a voltage signal applied across the capacitor;
receiving, from the voltage sensor, the voltage signal applied across the capacitor;
receiving, by a first low pass filter connected to the current sensor, the current signal;

filtering, by the first low pass filter, the received voltage signal at a dominant frequency, wherein the dominant frequency is a frequency with a maximum amplitude, and wherein the first low pass filter attenuates current signals with frequencies higher than the dominant frequency;

receiving, by a second low pass filter connected to the voltage sensor, the voltage signal;

filtering, by the second low pass filter, the received current signal at the dominant frequency, wherein the second low pass filter attenuates voltage signals with frequencies higher than the dominant frequency;

sampling, by a sampler connected to the first low pass filter and the second low pass filter, each of the filtered voltage signal and the filtered current signal;

performing a fast Fourier transform of each of the sampled voltage signal and the sampled current signal, wherein performing the fast Fourier transform for each of the filtered voltage signal and the filtered current signal comprises measuring a value of the current signal and the voltage signal over a sampling interval;

transforming each of the discretized voltage signal and the discretized current signal into frequency domain, wherein transforming each of the discretized voltage signal and the discretized current signal into frequency domain comprises determining currents and voltages present in each of the discretized voltage signal and the discretized current signal at different frequencies determining an impedance of the capacitor from the transformed voltage signal and the transformed current signal;

determining a capacitive reactance of the capacitor from an imaginary part of the impedance; and determining the capacitance value of the capacitor from the capacitive reactance.

12. The method of claim 11, wherein filtering each of the received voltage signal and the received current signal with the low pass filter comprises further filtering each of the received voltage signal and the received current signal with the low pass filter at the dominant frequency.

13. The method of claim 11, wherein determining the impedance of the capacitor from the transformed voltage signal and the transformed current signal comprises determining the impedance as $$Z(kf_{df}) = \frac{(real(V(kf_{df})) + imag(V(kf_{df})))}{(real(I(kf_{df})) + imag(I(kf_{df})))}$$

where $V(kf_{df})$ and $I(kf_{df})$ are the voltage and current values obtained from the transformed discretized current signal $I[n]$ and the transformed discretized voltage signal $V[n]$ at the dominating frequency and where k is $\{1, 2, 3, 4, 5, \ldots\}$.

14. The method of claim 13, further comprising determining the capacitive reactance of the capacitor from the imaginary part of the impedance as: $X_C(kf_{df})=imag(Z(kf_{df}))$.

15. The method of claim 14, further comprising determining the capacitance value of the capacitor from the capacitive reactance as:

$$C_{estm1}(kf_{df}) = \frac{1}{2\pi k f_{df} X_C(kf_{df})}$$

where $f_{df}$ is the dominating frequency.

16. The method of claim 11, wherein determining the impedance of the capacitor from the transformed voltage signal and the transformed current signal comprises determining the impedance as $$Z(kf_{df}) = \frac{(real(V(kf_{df})) + imag(V(kf_{df})))}{(real(I(kf_{df})) + imag(I(kf_{df})))}$$

where $V(kf_{rf})$ and $I(kf_{rf})$ are the voltage and current values obtained from the transformed current signal $I[n]$ and the transformed voltage signal $V[n]$ at a ripple frequency and where k is $\{1, 2, 3, 4, 5, \ldots\}$.

17. The method of claim 11, wherein a rate of sampling of each of the filtered voltage signal and the filtered current signal is predetermined.

18. The method of claim 11, wherein each of the filtered voltage signal and the filtered current signal are sampled in parallel.

19. The method of claim 11, wherein the Fast Fourier transform for the filtered voltage signal and the filtered current signal is performed in parallel using a dedicated Fast Fourier transform operator.

20. The method of claim 11, wherein further comprising:
    determining a series resistance of the capacitor from a real part of the impedance.

* * * * *